(12) United States Patent  (10) Patent No.: US 6,674,137 B2
Nissa  (45) Date of Patent: Jan. 6, 2004

(54) SEMICONDUCTOR DEVICE AND ITS MANUFACTURING METHOD

(75) Inventor: Mitsuo Nissa, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/997,593

(22) Filed: Nov. 29, 2001

(65) Prior Publication Data

US 2002/0135002 A1 Sep. 26, 2002

(30) Foreign Application Priority Data

Dec. 1, 2000 (JP) ........................................ 2000-366901

(51) Int. Cl.[7] ........................ H01L 27/108; H01L 29/76; H01L 29/94; H01L 31/119; H01L 31/062; H01L 31/113

(52) U.S. Cl. ........................ 257/408; 257/344; 257/296; 257/412; 257/413; 257/390

(58) Field of Search ................................ 257/336, 344, 257/288, 368, 382, 384, 401, 412, 768, 413, 390, 296, 408; 438/386, 399, 585, 592

(56) References Cited

U.S. PATENT DOCUMENTS

| | | | |
|---|---|---|---|
| 5,834,816 A | * 11/1998 | Jang | ........................... 257/382 |
| 5,877,530 A | * 3/1999 | Aronowitz et al. | .......... 257/344 |
| 6,306,710 B1 | * 10/2001 | Long et al. | .................. 438/279 |
| 6,387,743 B1 | * 5/2002 | Shiozawa et al. | ............ 438/199 |

FOREIGN PATENT DOCUMENTS

| | | |
|---|---|---|
| JP | 07-266499 | 8/1995 |
| JP | 09-074196 | 3/1997 |
| JP | 10-012747 | 1/1998 |
| JP | 11-045995 | 2/1999 |

OTHER PUBLICATIONS

English Bibliographies and Abstracts of JP 07–266499, JP 09–074196, JP 11–045995, and JP 10–012747 (noted above).

\* cited by examiner

*Primary Examiner*—Nathan J. Flynn
*Assistant Examiner*—Victor A. Mandala, Jr.
(74) *Attorney, Agent, or Firm*—Darryl G. Walker; Bradley T. Sako

(57) ABSTRACT

A semiconductor device is disclosed that can include a gate electrode (6) having a lower layer (6a) and a higher layer (6b), a mask insulating film (7) formed over a higher layer (6b). A side surface insulating film (9) may be formed on sides of a gate electrode (6) and a side wall insulating film (8) may be formed on the sides of a gate electrode (6) and mask insulating film (7). A low density impurity region (3) may be formed with a gate electrode (6) and side surface insulating film (9) as a mask. A higher density impurity region (4) may be formed with a gate electrode (6) and side wall insulating film (8) as a mask. A contact plug (10) may be formed between side wall insulating films (8) that contacts a higher density impurity region (4). A gate electrode (6) may have a reverse tapered shape when viewed in cross section. A lower layer (6a) may have a reverse tapered shape and/or a side surface insulating film (9) may have a greater thickness on sides of a higher layer (6b) than on a lower layer (6a).

12 Claims, 4 Drawing Sheets

SEMICONDUCTOR DEVICE AND ITS MANUFACTURING METHOD

TECHNICAL FIELD

The present invention relates generally to a semiconductor device and its method of manufacture, and more particularly to a semiconductor device having a gate electrode with a high aspect ratio and a narrow pitch, preferably a dynamic random access memory (DRAM).

BACKGROUND OF THE INVENTION

It remains a continuing goal of semiconductor manufacturing to fabricate devices with smaller and smaller features. One such feature can include a transistor gate length. As gate lengths approach smaller and smaller sizes, transistors can suffer from the unwanted generation of hot carriers, which can lead to "short" channel effects. Short channel effects can reduce the reliability of transistors.

One approach to addressing reduced reliability from short channel effects can include reducing the electric field region in the vicinity of a transistor drain. A structure for reducing such an electric field can include a lightly doped drain (LDD). An LDD structure can include a region between a channel (situated below a transistor gate) and a source/drain region that has a lower impurity density than the source/drain region. Such a structure can result in a less severe, or milder impurity density than non-LDD structures. This can raise a punch-through voltage and/or hot carrier withstand voltage in a transistor, thus improving reliability.

Japanese Laid-Open Patent Application Nos. 226499/1995, 074196/1997 and 45995/1999 disclose a structure that includes an LDD region. In the disclosed structure, a silicon oxide film, a silicon nitride film, or a reoxidizied nitrided oxide (RNO) can be formed on a gate electrode side wall.

Japanese Laid-Open Patent Application No. 226499/1995 also discloses an oxide film that covers a gate electrode. The oxide film can improve product yield by recovering a damaged gate oxide film to an original condition.

Referring now to FIGS. 1(a) to 1(d), a series of cross sectional views are shown illustrating a conventional method for manufacturing a semiconductor device. The method of FIGS. 1(a) to 1(d) can correspond to that shown in Japanese Laid-Open Patent Application No. 226499/1995.

Referring now to FIG. 1(a), a device isolation film (not shown) is formed on a semiconductor substrate 1. Substrate 1 may be p-type silicon. A gate oxide film 5 may be formed in a field (or active) region with a thermal oxidation method. A field region may be surrounded by a device isolation film, which may include silicon oxide. Thereafter, polysilicon may be formed on the gate oxide film 5 with a reduced pressure chemical vapor deposition (CVD) method. A gate electrode 6 may be formed from the polysilicon with known photolithography and dry etching techniques.

Next, as shown in FIG. 1(b), an oxide film 13 is formed that covers gate electrode 6 with a heat treatment in an oxygen atmosphere. As noted before, oxide film 13 can recover gate oxide film 5 that has been damaged.

Thereafter, as shown in FIG. 1(c), an entire surface of a substrate 1 is implanted with low density ions, with ion implantation techniques. Gate electrode 6 may be an implant mask. Annealing under predetermined conditions may result in N− type source/drain region 3.

Then, as shown in FIG. 1(d), a silicon oxide film, etc., is deposited on the entire surface of the substrate 1 with reduced pressure CVD methods, or the like. The silicon oxide film may then be etched back with anisotropic dry etching to form side wall oxide film 14 on a side wall of gate electrode 6. A high density ion implantation may then be performed with gate electrode 6 and side wall oxide film 14 as masks, to form N+ source/drain region 4.

In a resulting structure, a low density impurity region (e.g., N− type source/drain region 3) may be formed that is offset with respect to a gate electrode 6. Such a low density impurity region may also be self-aligned with a gate electrode 6, just under side wall oxide film 14. At the same time, a high density impurity region may (e.g., N+ type source/drain region 4) is formed on the outside of side wall oxide film 14.

In a conventional approach like that described above, a substrate region below an end of a gate electrode 6 may not be implanted, and thereby not form a portion of a low density impurity region. This may be particularly true when a side surface film, such as an oxide film and/or nitride film, is formed on a side of a gate electrode 6. Such a side surface film (like 13) may block ions from penetrating into a substrate. Thus, a substrate region offset with respect to a gate electrode 6 is prevented from being effectively implanted. Due to such a non-implanted region, a resulting source/drain region may have a higher than desirable resistance, unduly slowing the speed of a metal-oxide-semiconductor (MOS) transistor.

To solve the problem of high resistance offset regions, a method is disclosed in Japanese Laid-Open Patent Application Nos. 074196/1997 and 012747/1998. The method shows forming N− type source/drain regions with a low density impurity implantation having a tilted implant angle. That is, impurities are implanted at a slant with respect to a normal line of a substrate. Such tilt implant approaches can address the problem of failing to implant close enough to a gate electrode for certain device features. However, as feature sizes shrink and/or are changed, such methods may not be sufficient.

As features sizes shrink, a width of a sidewall oxide film (such as that shown as 14 in FIG. 1(d)) can also shrink. This may be desirable in order to increase a contact area. A smaller sidewall thickness, however, may translate into a smaller interval between a channel region and a higher density impurity region of a source/drain formed outside a side wall oxide film. This reduced interval may result in a leakage current due to a strong electric field at the end of a gate, and thus reduce the data retention times of a transistor.

In addition, in many cases a gate electrode 6 can have a laminated structure that includes a polysilicon layer and a silicide layer. Such laminated gate electrodes may have a greater height, further increasing an aspect ratio (height/width) of a gate electrode. The above noted problem of an undesirably narrow interval may be more conspicuous for higher aspect ratio structures.

To better understand the drawbacks to conventional approaches, a conventional manufacturing method for a semiconductor device will now be described with reference to FIGS. 2(a)–2(e). FIGS. 2(a)–2(e) show cross sectional views of a semiconductor device having structures with high aspect ratios.

Referring first to FIG. 2(a), a device isolation film 2 is formed in a semiconductor substrate 1. A semiconductor substrate 1 can comprise p type silicon, or the like, and a device isolation film 2 may be an oxide. A gate insulating film 5 comprising silicon oxide may be formed on a semiconductor substrate 1 with a thermal oxidation method. A gate insulating film 5 may cover a field region situated between device isolation films 2. Thereafter, a polysilicon film 6a and silicide film 6b may be formed using a plasma CVD (PCVD) method, or the like. A mask nitride film 15 may then be formed. A mask nitride film 15 may serve as an etch stop that can prevent a silicide film 6b from being exposed in a side wall etch back step (described more below). A patterning step may then etch through a mask nitride film 15, silicide film 6b, and polysilicon film 6a to form a gate electrode 6. Such a patterning step includes known photolithography and dry etching steps.

In addition to protecting a gate 6, during an etch back step that forms side wall oxide layers, a mask nitride film 15 can also serve as an etch stop in a self-aligned contact structure. In a self-aligned contact structure, a contact hole may overlap a gate electrode 6. During a contact hole etching step, side wall oxide layers and top mask nitride film prevent a gate electrode 6 from being exposed. In order to ensure such protection of a gate electrode 6, a mask nitride may have a certain minimum thickness. Such a mask nitride film 15 thickness may further contribute to the aspect ratio of a resulting gate structure.

Referring now to FIG. 2(b), exposed portions of a substrate are implanted with a low density impurity ion. Gate electrode 6 and mask nitride film 15 may act as implant masks. As represented by arrows in FIG. 2(b), such an ion implantation may be a tilt implantation (implant at a slant with respect to a substrate 1). As a result, substrate regions in the vicinity of a gate electrode 6, that might otherwise not be implanted with a conventional non-tilt implant, can be implanted with an impurity ion. This can eliminate the high resistance offset region noted above. After an annealing step, low density LDD type source/drain regions can be formed. For example, an N− source/drain region 3 is formed.

Referring now to FIG. 2(c), a silicon oxide film, or the like, is deposited over the entire surface of a substrate 1. Such a deposition can include a reduced pressure CVD method, or the like. A resulting silicon oxide film is then etched back, with anisotropic dry etching, to form side wall oxide film 14 on the side wall of gate electrode 6 and mask nitride film 15. It is noted that in such an etchback step, a mask nitride film 15 can serve as an etch stop, protecting a gate electrode 6 from being exposed.

Referring now to FIG. 2(d), exposed portions of a substrate are implanted with a high density impurity ion. Gate electrode 6, mask nitride film 15, and side wall oxide film 14 serve as implant masks. After an annealing step, high density source/drain regions can be formed. For example, an N+ source/drain region 4 is formed.

Referring now to FIG. 2(e), a contact plug 10 is formed in regions between adjacent side wall oxide films 14. An interlayer insulating film, such as a borophosphosilicate glass (BPSG) film 11, can be formed over a contact plug. Contact holes may be formed in a BPSG film 11 and a conductor may be formed in such contact holes. In FIG. 2(e), a bit contact hole 12a and capacitive contact hole 12b may be formed in a BPSG film 11. In this way, a semiconductor device may be partially completed.

The above conventional approach shows how low density impurity regions can be formed in close proximity to the end of a gate electrode 6 with a tilt implant. However, at the same time, a side wall oxide film 14 thickness may be reduced to ensure sufficient area between a contact plug 10 and N+ source/drain region 3 and/or due to a high aspect ratio of a gate electrode 6. As a result, as shown in FIG. 2(e), a distance between a contact plug 10 and the end of a gate electrode 6 (shown as "NARROW INTERVAL") can become small. This reduction in the interval size can result in the deterioration of data retention characteristics of a resulting transistor due to leakage current.

It would be desirable to arrive at some way of preventing the data retention characteristics of a transistor from being degraded due to decreased size of an interval between a contact plug and an end of a gate electrode.

SUMMARY OF THE INVENTION

A semiconductor device according to the present invention may include a gate electrode having a reverse tapered shape when viewed in cross section. A reverse tapered shape may be formed by etching a lower layer of laminate gate electrode into a reverse tapered shape. In addition, or alternatively, a side surface insulating film may be formed on the side of a gate electrode that is thicker on the sides of an upper layer of the gate electrode than on the sides of a lower layer of a gate electrode.

With a reverse tapered shape in a gate electrode, a semiconductor device can include a greater interval distance between the edge of a gate electrode and a contact plug. Such greater interval may be achieved even for semiconductor devices having reduced pitch and gate electrodes with a high aspect ratio. In addition, a low- or non-doped offset region at the end of a gate electrode may be prevented from being formed. Thus, leakage current may be reduced and a data retention time of a resulting transistor may be improved.

According to one aspect of the embodiments, a lower layer of a gate electrode may include polysilicon while an upper layer may include a silicide, such as tungsten silicide.

According to another aspect of the embodiments, a side surface insulating film may be formed by oxidizing a gate electrode. Such an oxidation may occur at a temperature between 1000 and 1100° C.

According to another aspect of the invention, a mask insulating layer may be formed on a top of a gate electrode and a side wall insulating film may be formed on sides of a mask insulating layer and a gate electrode. A mask insulating layer may include silicon oxide while a side wall insulating film may include silicon nitride.

According to another aspect of the embodiments, gate electrode, including a corresponding side surface insulating film, may have a particular inclination angle with respect to a substrate. In particular, a line can be conceptualized as being drawn from an outer edge of a side surface insulating film on the side of an upper layer to an outer edge of a side surface insulating film on the side of a lower layer. Such a line may have an incidence angle that is no greater than 15° with respect to a normal to the substrate. Preferably, an incidence angle may be about 7°.

According to another aspect of the embodiments, a first (lower) density impurity region may be formed, at least in part, by a tilt impurity implant with a gate electrode and side surface insulating film as a mask. A tilt angle may preferably be coincident with an angle of incidence of a gate electrode.

According to another aspect of the embodiments, a second (higher) density impurity region may be formed, at least in part, by an impurity implant with a gate electrode and side wall insulating film as a mask.

According to another aspect of the embodiments, a contact plug may be formed between side wall insulating films on sides of adjacent gate electrodes.

DETAILED DESCRIPTION OF THE EMBODIMENTS

Various embodiments will now be described with reference to a number of figures.

Figure 1A:
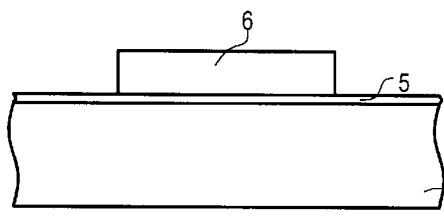
FIGS. 1(a) to 1(d) are cross sectional views of a portion of a semiconductor device that show a conventional manufacturing method.
Figure 1B:
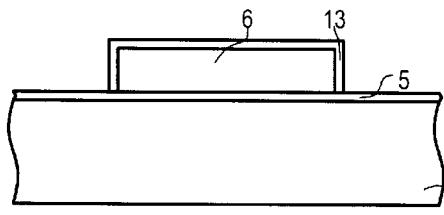
Figure 1C:
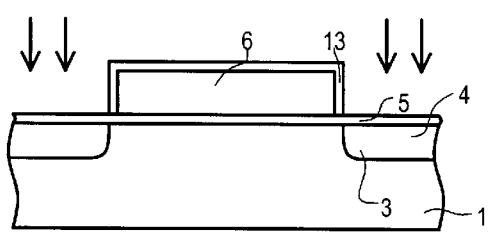
Figure 1D:
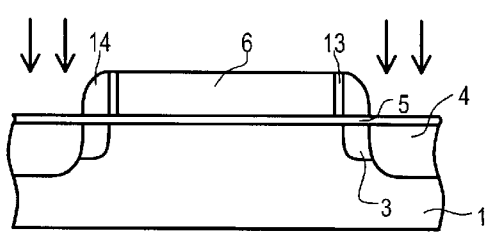
Figure 2A:
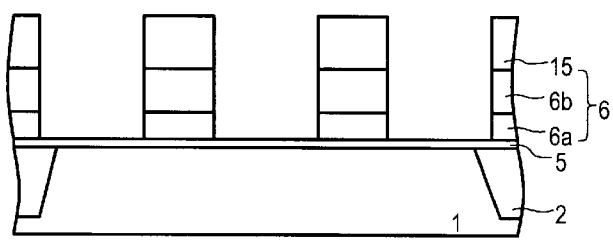
FIGS. 2(a) to 2(e) are cross sectional views of a portion of a semiconductor device that show another conventional manufacturing method.
Figure 2B:
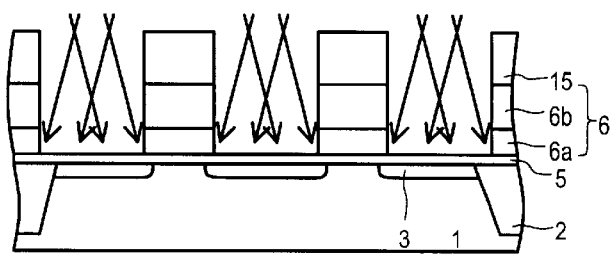
Figure 2C:
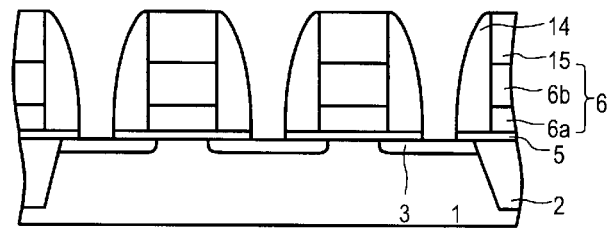
Figure 2D:
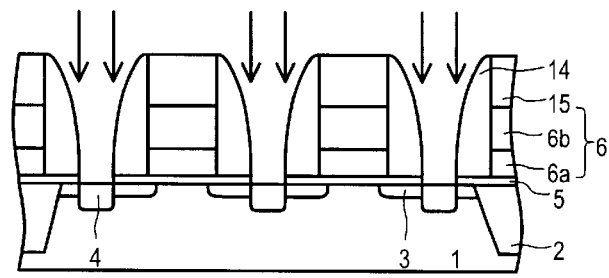
Figure 2E:
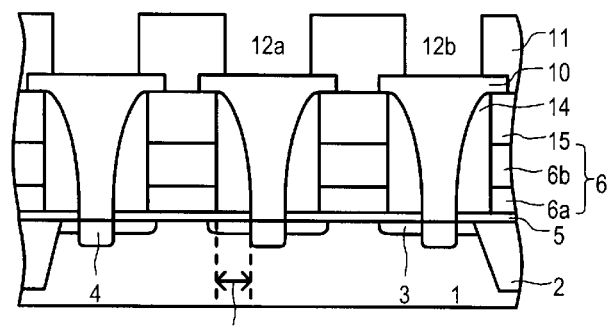
Figure 3:
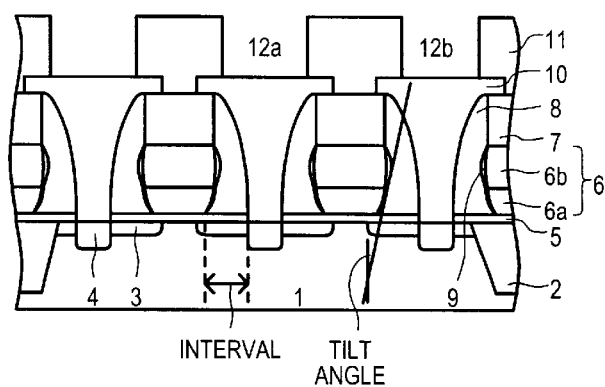
FIG. 3 is a cross sectional view showing the construction of a semiconductor device according to one embodiment.

Referring now to FIG. 3, the construction of a semiconductor device according to one embodiment of the present invention will now be described. According to the embodiment shown, a semiconductor device according to the present invention could include one or more of the following features.

A first feature of a semiconductor device according to one embodiment may include a gate electrode 6 having a particular structure. Such a gate electrode 6 may include a laminate structure with a lower layer 6a and a higher layer 6b. According to one approach, a lower layer 6a may include polycrystalline silicon (polysilicon), while a higher layer 6b may include of tungsten silicide. Such a gate electrode 6 may be processed to include a reverse tapered configuration. For example, at least a portion of a lower layer 6a may have a narrower width than a higher layer 6b.

A second feature of a semiconductor device according to one embodiment may include a masking film 7 on a gate electrode 6 that is formed from silicon dioxide. This may vary from conventional approaches that include a silicon nitride film formed over a gate electrode.

A third feature of an embodiment may include a side surface insulating film 9 formed on a side of a gate electrode 6. Such a side surface insulating film 9 may be a high temperature oxide film formed with a high temperature thermal oxidation at a predetermined temperature condition. In one particular approach, a side surface insulating film 9 may have a greater thickness on a side of a higher layer 6b (e.g., a tungsten silicide layer) than a lower layer 6a (e.g., a polysilicon layer).

A fourth feature of one embodiment can include particular impurity regions formed in a substrate. A low density impurity region 3 may be formed by a tilt ion implantation. Such a region may be an N− type source/drain region 3. A high density impurity region 4 may be formed between particular structures. In particular, a high density impurity region 4 may be formed between side wall insulating films 8. Such a region may be an N+ type source/drain region.

As further shown in FIG. 3, a semiconductor device may include a contact plug 10 that is situated between adjacent side wall insulating films 8 and in contact with a substrate 1. A contact plug 10 may comprise polysilicon, or the like, and may be formed in a self-aligned fashion with respect to one or more gate electrodes 6.

An embodiment can also include an insulating film 11 formed over a substrate. Such an insulating film may include borophosphosilicate glass (BPSG). Contact holes may be formed in an insulating film 11 to a contact plug 10. An embodiment may be included in a dynamic random access memory (DRAM) type device, as such devices can typically include very dense features. In such an application, contact holes in an insulating film 11 may include a bit contact 12a and a capacitor contact 12b.

According to the present invention a gate electrode 6 may have various features, including a reverse tapered shape. As shown in FIG. 3, a lower layer 6a of a gate electrode 6 (e.g., a polysilicon layer) may have a reverse tapered shape. In addition, or alternatively, an entire gate electrode 6 may have a reverse tapered shape according to a film thickness on sides of a lower layer 6a and higher layer 6b of a gate electrode 6. More particularly, a side surface oxide film 9 may be formed on a side of a gate electrode 6 that is thicker on sides of an upper layer 6b, but thinner on sides of a lower layer 6a. A side surface oxide film 9 may be a high temperature oxide film.

With a gate electrode 6 having a reverse tapered shape, a low density impurity can be implanted at a tilt angle. A representation of such a tilt angle is shown in FIG. 3 as "TILT ANGLE." This may prevent a low or non-doped region from being formed at an end of gate electrode, as may occur with non-tilt implant approaches. At the same time, as shown in FIG. 3, a length of a low density impurity region (i.e., a distance between a contact plug 10 and an end of gate electrode 6) may be increased over conventional tilt implant approaches. Such a length is shown as "INTERVAL" in FIG. 3.

Referring now to FIGS. 4(a) to (e), a series of cross sectional views of a semiconductor device will be described that illustrate a manufacturing method according to one embodiment. Such a method may be used to fabricate a device like that shown in FIG. 3.

Figure 4A:
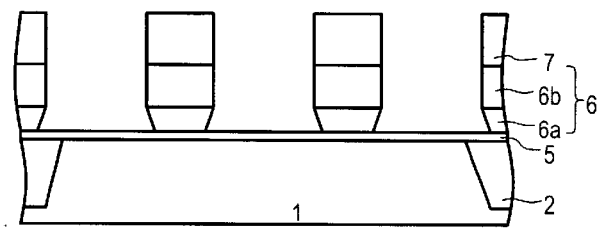
FIGS. 4(a) to 4(e) are cross sectional views showing a method of manufacturing a device such as that shown in FIG. 3.

Referring to FIG. 4(a), a device isolation film 2 may be formed in a substrate 1. Device isolation film 2 may define a field (or active) region. In one arrangement, a device isolation film 2 may include an oxide formed in a p-type silicon substrate. A gate dielectric 5 may then be formed over a surface of a substrate 1. Such a gate dielectric 5 may comprise silicon oxide formed with a heat oxidation method, or the like.

A lower layer 6a for a gate electrode may then be formed over a substrate 1. A higher layer 6b may then be formed on a lower layer 6a. A lower layer 6a may preferably comprise polysilicon deposited to a thickness of about 100 nm, while a higher layer 6b may comprise tungsten silicide deposited to a thickness of about 140 nm. A mask insulating film 7 may be formed over a higher layer 6b. A mask insulating film 7 may preferably comprise silicon oxide having a thickness of about 200 nm. As will be described in more detail below, mask insulating film 7, in combination with insulating side wall films 8 (not shown in FIG. 4(a)), may serve as an etch stop to protect a gate electrode 6 in one or more subsequent etching steps.

It is noted that particular embodiments of the present invention can differ from conventional approaches described. A mask insulating film 7 may be formed from silicon oxide, instead of silicon nitride, and insulating side wall films 8 may be formed from silicon nitride instead of silicon oxide.

A resist pattern may then be formed using known photolithography steps. Such a resist pattern may then be used as an etch mask to etch through a mask insulating film 7, an upper layer 6b and a lower layer 6a. Such an etching step may include dry etching. However the dry etching may differ from conventional approaches by forming a lower layer 6a that has a reverse tapered shape. As noted above, such a reverse tapered shape can increase an interval between a contact plug 10 and an end of a gate electrode 6.

According to one embodiment, a lower layer 6a may be polysilicon, and such a layer may be etched into a reverse tapered shape by selecting a particular reactant gas and adjusting the flow rate of such a gas.

In one approach, etching a polysilicon lower layer 6a into a reverse tapered shape may include dry etching with hydrogen bromide (HBr) as a reactant gas. HBr may be introduced into an etch chamber at a flow rate of about 100 to 200 standard cubic centimeters per minute (sccm). With such an etching approach, a lower portion of a polysilicon lower layer 6a may be etched more than an upper portion of side portion of such a layer to form a reverse tapered shape as shown in FIG. 4(a).

Figure 4B:
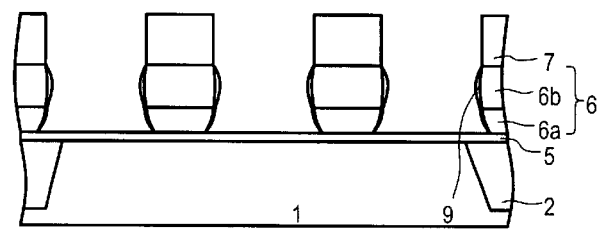

Referring to FIG. 4(b), a method according to one embodiment may further include forming side surface film 9 on sides of a gate electrode 6. Such a side surface film 9 forming step may include a heat step that may reduce defects in a surface of a semiconductor substrate 1 and/or improve diffusion interface profiles.

In one particular approach, a side surface film 9 may be an oxide that can be formed with a rapid thermal oxidation (RTO) process. An RTO process according to an embodiment may include oxidizing a gate electrode 6 in an atmosphere of oxygen at a temperature in the range of about 1000° C. to 1100° C. The present inventor has found that such an RTO process may result in a side surface film 9 that can have a different thickness in a lower layer 6a than in a higher layer 6b. Such a difference may depend upon an oxide formation temperature for forming a side surface film 9.

Figure 5:
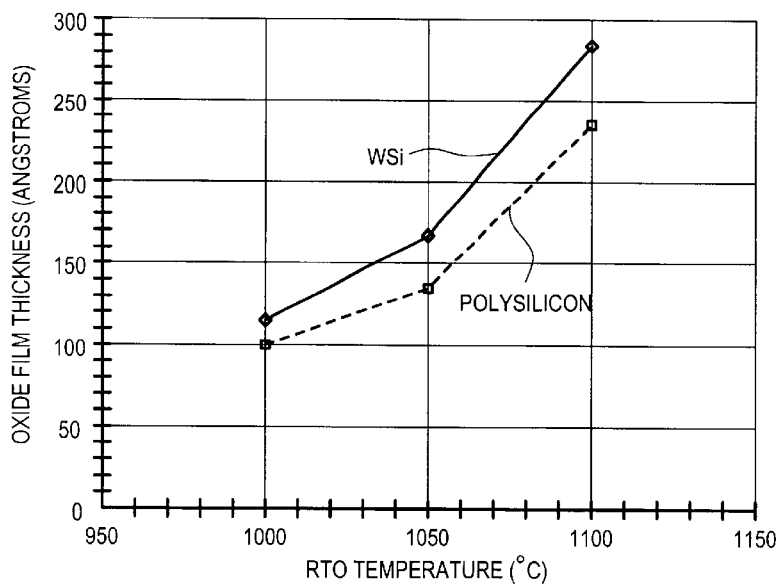
FIG. 5 is a graph showing a relationship between an oxide film thickness and a film formation temperature.

A correlation between an oxidation temperature and corresponding side surface film 9 has been investigated. Film formation temperature was varied within an RTO temperature range of about 1000° C. to 1100° C. Data results are shown in Table 1 below and represented by a graph in FIG. 5. The data and graph show that as an RTO temperature rises, side surfaces of a polysilicon lower layer 6a and tungsten silicide (WSi) higher layer 6b can be oxidized, to thereby grow an oxide. In FIG. 5, thickness results for a side surface oxide film for a WSi layer are shown by diamond points and a solid line, while thickness results for a side surface oxide film for a polysilicon layer are shown by square points and a dashed line. A side surface oxide film for a WSi layer is thicker.

In this way a gate electrode may have a reverse tapered shape by forming a thicker side surface film 9 on an upper layer 6b and a thinner side surface film 9 on a lower layer 6a.

TABLE 1

| RTO Temp (° C.) | Film Formation Time (sec) | Silicide Side Thickness (nm) | Polysilicon Side Thickness(nm) |
|---|---|---|---|
| 1000 | 60 | 12 | 10 |
| 1050 | 60 | 17 | 13 |
| 1100 | 60 | 28 | 23 |

In one very particular embodiment, a side surface film 9 may include an oxide having a thickness of about 10 to 15 nm on a side surface of a silicide higher layer 6b, and an oxide having a thickness of about 7 to 10 nm on a side surface of a polysilicon lower layer 6a. A gate electrode 6 and corresponding side surface film 9 may have a reverse tapered configuration having an inclination angle within about 15° with respect to a normal line of substrate.

An angle of inclination for a reverse tapered shape may be selected according to various factors including an incident angle of a low density impurity tilt implant and/or a resulting structure of a side wall insulating film (not shown in FIG. 4(b)). Experiments by the present inventor have found that a preferred inclination angle may be about 7°.

It is additionally noted that an oxidation temperature of 950° C. was found to form only a slight side surface oxide film 9. Such a small thickness appeared to have no substantial effect on a data retention characteristic of a resulting transistor. Conversely, oxidation temperatures in excess of 1150° C. were found to result in transistor failures. Consequently, for the specific materials and thickness noted above (polysilicon lower layer, WSi higher layer, oxide mask insulating film, and nitride side wall insulating film), a side surface oxidation temperature is preferably within the range of about 1000° C. to 1100° C.

Figure 4C:
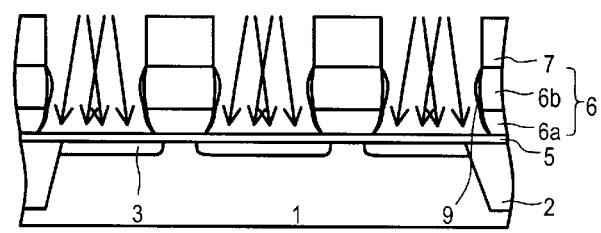

Following a formation of gate electrode 6 having a reverse tapered structure, a tilt angle low density impurity implantation may take place. Such a step may result in an N–type source/drain region 3, as shown in FIG. 4(c). A tilt angle may result in ions being implanted in closer proximity to an end of a gate electrode 6 than non-tilt implants. This, as noted above, may prevent a low or non-doped region (an offset region) from being formed between a channel region and a higher density impurity region. In one particular approach, implanted impurities may include phosphorous (P), or the like.

It is noted that if a tilt implant angle (angle of inclination with respect to a normal line of the substrate) is too small, a low- or non-doped offset region may be formed (as previously described), deteriorating the performance of a resulting transistor. Conversely, if a tilt implant angle is too large, ions may be obstructed by an adjacent gate electrode 6, and thus deteriorate the effectiveness of an ion implantation. Therefore, according to one embodiment, a tilt angle may be coincident with an inclination angle of a reverse tapered gate electrode 6.

Figure 4D:
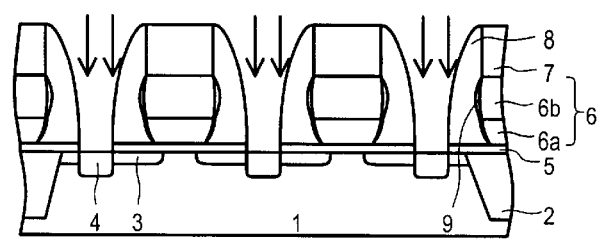

Referring now to FIG. 4(d), a side wall insulating film may be deposited over an entire surface of a semiconductor device. Such a film may then be etched back to form side wall insulating films 8 on side surfaces of a gate electrode 6 (which can include side surface film 9) and a mask insulating film 7. As noted above, side wall insulating films 8 may formed from silicon nitride. It is noted that if a side wall insulating film 8 width is too great, than a distance between a gate electrode 6 and contact plug (not shown in FIG. 4(d)) may be increased. However, such an increase comes at the cost of reduced contact area, which may undesirably increase contact resistance.

As is known, a width of a side wall insulating film can change depending upon the requirements of a semiconductor device. As pitch (spacing between adjacent structures) decreases, a width of a side wall insulating film may also decrease. Such a decrease in side wall insulating film thickness can decrease the interval between and end of a gate electrode and a contact plug. As noted above, this can deteriorate the data retention characteristics of a transistor. However, according to embodiments of the present invention, a gate electrode 6 may have a reverse tapered configuration, with a bottom of a lower layer 6a being narrowed. Thus, the aforementioned drawbacks arising from intervals that are too small may be avoided, even for narrow pitch semiconductor devices.

According to one embodiment, a width of a side wall insulating film 8 may be about 60 nm.

Figure 4E:
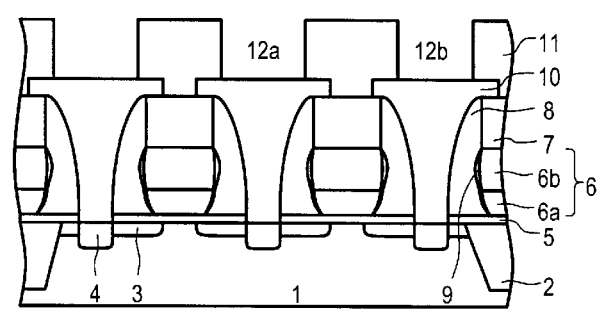

Referring to FIG. 4(e), a region between side wall insulating films 8 may be subject to a high density impurity implantation. Such an implantation may be at an essentially vertical angle and result in a high density impurity region 4, which may be an N+ source/drain region. A contact plug 10 may then be formed between side wall insulating films 8 that is in contact with a substrate 1. A contact plug 10 may thus be a self-aligned contact plug 10.

An interlayer film 11 may be formed over a contact plug 10. Such an interlayer film 11 may include deposited BPSG. Contact holes may then be formed in interlayer film 11 to expose contact plugs 10. In one particular DRAM arrangement, a bit contact 12a and capacitor contact 12b may be formed.

In this way, a semiconductor device may be partially manufactured according to one embodiment of the present invention.

According to a particular embodiment of the present invention, a gate electrode 6 may have a reverse tapered configuration. Such a reverse tapered configuration may be formed by a lower layer 6a having a narrower bottom portion accomplished by adjusting dry etching parameters, as well as a side surface film 9 that contributes to a reverse tapered shape. In particular, a side surface film 9 may be an oxide grown by adjusting temperature parameters so that an oxide is thicker on a higher layer 6b of a gate electrode than a lower layer 6a. Further, a low density ion implantation may be performed with a tilt angle that is essentially coincident with a reverse tapered angle of a gate electrode 6. This can help ensure that a low density impurity is formed close to an end of a gate electrode, preventing an unwanted offset region that has undesirably low, or no doping at all. At the same time, a distance between a contact plug 10 and an end of a gate electrode 6 may be increased over conventional approaches. Thus, a leakage current caused by a strong electric field at the vicinity of the end of a gate electrode 6 can be reduced. This, in turn, may improve the data retention times of a resulting transistor.

In order to characterize the advantages of the above-described embodiment, various devices were manufactured by way of trial to investigate data retention times of non-defective products. Such devices were manufactured with different tilt implant angles for a low density ion implantation step, as described above. Results of the experiment are represented in FIG. 6.

Figure 6:
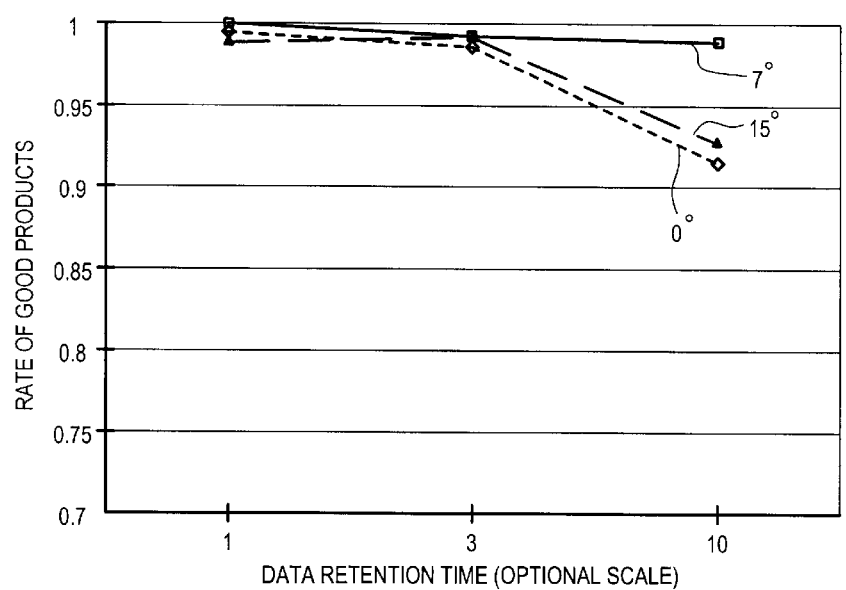
FIG. 6 is a graph showing a relationship between a low density impurity implant angle according to the present invention and a data retention rate of a transistor.

Referring now to FIG. 6, a graph is shown that compares a data retention time (axis of abscissas) to a rate at which a non-defective product may achieve a data retention time (axis of ordinates). Three types of products are shown, each having a different low impurity ion tilt implantation angle. Results for devices with a tilt implant angle of 0° are shown with a short dashed line and diamond points. Results for devices with a tilt implant angle of 7° are shown with a solid line and square points. Results for devices with a tilt implant angle of 15° are shown with a long dashed line and triangular points. Higher data retention times are to the right in FIG. 6.

As illustrated in FIG. 6, a rate for non-defective products is clearly higher for samples having a tilt implant angle of about 7° than those having a tilt angle of about 0°. Thus, a structure according to embodiments of the invention may provide improved data retention times in a resulting transistor.

Referring again to FIG. 6, those non-defective products having a tilt implant angle of about 15° may have worse results than those having a tilt implant angle of about 7°. From this, it is believed that a tilt implant angle that is coincident with an incident angle of a gate electrode may result in a more conspicuous improvement in transistor performance. However, it is believed that in the case of a tilt implant angle of about 15°, the implant angle can be too large for a given gate electrode structure and/or angle of inclination (in this case 7°). Consequently, impurities are prevented from being effectively implanted in the vicinity of a gate electrode end, due to shadow effects or the like.

It is noted that above embodiments have described particular material combinations, including tungsten silicide as a higher layer 6b of a gate electrode 6, silicon oxide as a mask insulating film 7, and silicon nitride as a side wall insulating film 8. However, the present invention should not necessarily be limited to such materials. It would be obvious to one skilled in the art to employ materials having equivalent characteristics.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:
   at least one gate electrode formed over a semiconductor substrate having at least a portion with a reverse tapered shape when viewed in cross section;
   a mask insulating film formed on a top surface of the at least one gate electrode;
   a side surface insulating film formed on a side surface of the at least one gate electrode;
   a side wall insulating film formed on a side surface of the mask insulating film and the at least one gate electrode;
   a first impurity region formed in the semiconductor substrate with the at least one gate electrode and the side surface insulating film as a mask, and without the side wall insulating film as a mask; and
   a second impurity region formed in the semiconductor substrate with at least the side wall insulating film as a mask, the second impurity region having a higher impurity concentration than the first impurity region.

2. The semiconductor device of claim 1, wherein:
   the gate electrode has a laminated structure that includes at least a lower layer and a higher layer, at least the lower layer having a reverse tapered shape when viewed in cross section.

3. The semiconductor device of claim 2, wherein:

the lower layer comprises polysilicon.

4. The semiconductor device of claim 2, wherein:

the higher layer comprises a silicide.

5. The semiconductor device of claim 2, wherein:

the side surface insulating film is thicker on a side of the higher layer than on a side of the lower layer.

6. The semiconductor device of claim 5, wherein:

a line connecting an outer edge of the side surface insulating film on the side of the higher layer to an outer edge of the side surface insulating film on the lower layer has an inclination angle of no more than 15° with respect to a line normal to the substrate, when the gate electrode is viewed in cross section.

7. The semiconductor device of claim 6, wherein:

the inclination angle is about 7°.

8. The semiconductor device of claim 1, wherein:

the side surface insulating film is a gate electrode oxide.

9. The semiconductor device of claim 8, wherein:

the side surface insulating film is oxidized in an atmosphere comprising oxygen and within a temperature range of about 1000° C. to 1100° C.

10. The semiconductor device of claim 1, wherein:

the gate electrode has a laminated structure that includes at least a lower layer comprising polysilicon and at least an upper layer comprising silicon oxide;

the mask insulating film comprises silicon oxide; and the side wall insulating film comprises silicon nitride.

11. The semiconductor device of claim 1, further including:

a contact plug connected to the second impurity region and adjacent to the side wall insulating film.

12. The semiconductor device of claim 1, wherein:

a plurality of gate electrodes are separated from one another by a predetermined pitch; and an interval in the substrate between the end of each gate electrode and an adjacent second impurity region that is greater than a corresponding interval for a gate electrode that does not have a reverse tapered shape.

* * * * *